United States Patent
Han et al.

(10) Patent No.: US 9,082,653 B2
(45) Date of Patent: Jul. 14, 2015

(54) SEMICONDUCTOR DEVICES AND METHODS OF FABRICATING THE SAME

(71) Applicant: SAMSUNG ELECTRONICS CO., LTD., Suwon-si, Gyeonggi-do (KR)

(72) Inventors: Hauk Han, Hwaseong-si (KR); Yong-IL Kwon, Incheon (KR); JungSuk Oh, Seoul (KR); Tae sun Ryu, Seoul (KR); Jeonggil Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/561,788

(22) Filed: Dec. 5, 2014

(65) Prior Publication Data
US 2015/0084109 A1 Mar. 26, 2015

Related U.S. Application Data

(63) Continuation of application No. 13/940,721, filed on Jul. 12, 2013, now Pat. No. 8,928,092.

(30) Foreign Application Priority Data

Jul. 12, 2012 (KR) ........................ 10-2012-0076213

(51) Int. Cl.
| | |
|---|---|
| *H01L 27/115* | (2006.01) |
| *H01L 29/788* | (2006.01) |
| *H01L 23/52* | (2006.01) |
| *H01L 21/28* | (2006.01) |
| *H01L 29/423* | (2006.01) |
| *H01L 29/49* | (2006.01) |

(52) U.S. Cl.
CPC .... *H01L 27/11529* (2013.01); *H01L 21/28273* (2013.01); *H01L 23/52* (2013.01); *H01L 27/11521* (2013.01); *H01L 27/11526* (2013.01); *H01L 27/11531* (2013.01); *H01L 29/42328* (2013.01); *H01L 29/4941* (2013.01); *H01L 29/788* (2013.01); *H01L 29/7881* (2013.01); *H01L 2924/0002* (2013.01)

(58) Field of Classification Search
CPC ................... H01L 27/11526; H01L 27/11529; H01L 27/11531
See application file for complete search history.

(56) References Cited

U.S. PATENT DOCUMENTS

| | | |
|---|---|---|
| 6,969,650 B2 | 11/2005 | Yun et al. |
| 7,148,109 B2 | 12/2006 | Joo |

(Continued)

FOREIGN PATENT DOCUMENTS

| | | |
|---|---|---|
| JP | 2012-038835 | 2/2012 |
| KR | 10-2006-0011604 A | 2/2006 |

(Continued)

*Primary Examiner* — Eduardo A Rodela
(74) *Attorney, Agent, or Firm* — F. Chau & Associates, LLC

(57) ABSTRACT

A semiconductor device includes a lower insulating pattern on a semiconductor substrate, a lower gate pattern on the lower insulating pattern and formed of a doped polysilicon layer, a residual insulating pattern with an opening exposing a portion of a top surface of the lower gate pattern, an upper gate pattern on the residual insulating pattern, the upper gate pattern filling the opening, and a diffusion barrier pattern in contact with the portion of the top surface of the lower gate pattern and extending between the residual insulating pattern and the upper gate pattern.

20 Claims, 18 Drawing Sheets

(56) References Cited

U.S. PATENT DOCUMENTS

| | | |
|---|---|---|
| 7,495,284 B2 | 2/2009 | Lee |
| 2003/0213991 A1 | 11/2003 | Lee et al. |
| 2008/0146041 A1 | 6/2008 | Sasaki |
| 2009/0230451 A1 | 9/2009 | Lee et al. |
| 2010/0327341 A1 | 12/2010 | Suzuki |
| 2011/0312172 A1 | 12/2011 | Park et al. |
| 2012/0032246 A1 | 2/2012 | Honda et al. |
| 2012/0038009 A1 | 2/2012 | Toh et al. |
| 2013/0228843 A1 | 9/2013 | Lim et al. |

FOREIGN PATENT DOCUMENTS

| | | |
|---|---|---|
| KR | 10-2010-0012647 A | 2/2010 |
| KR | 10-2010-0019826 A | 2/2010 |

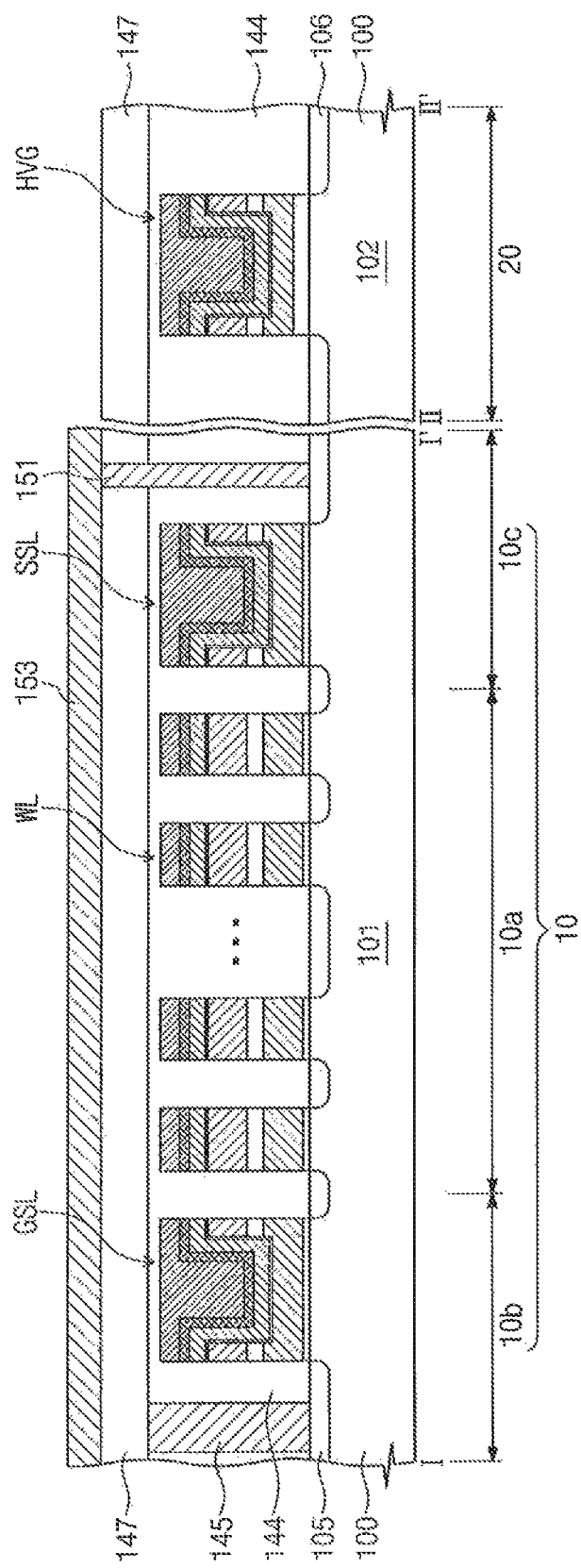

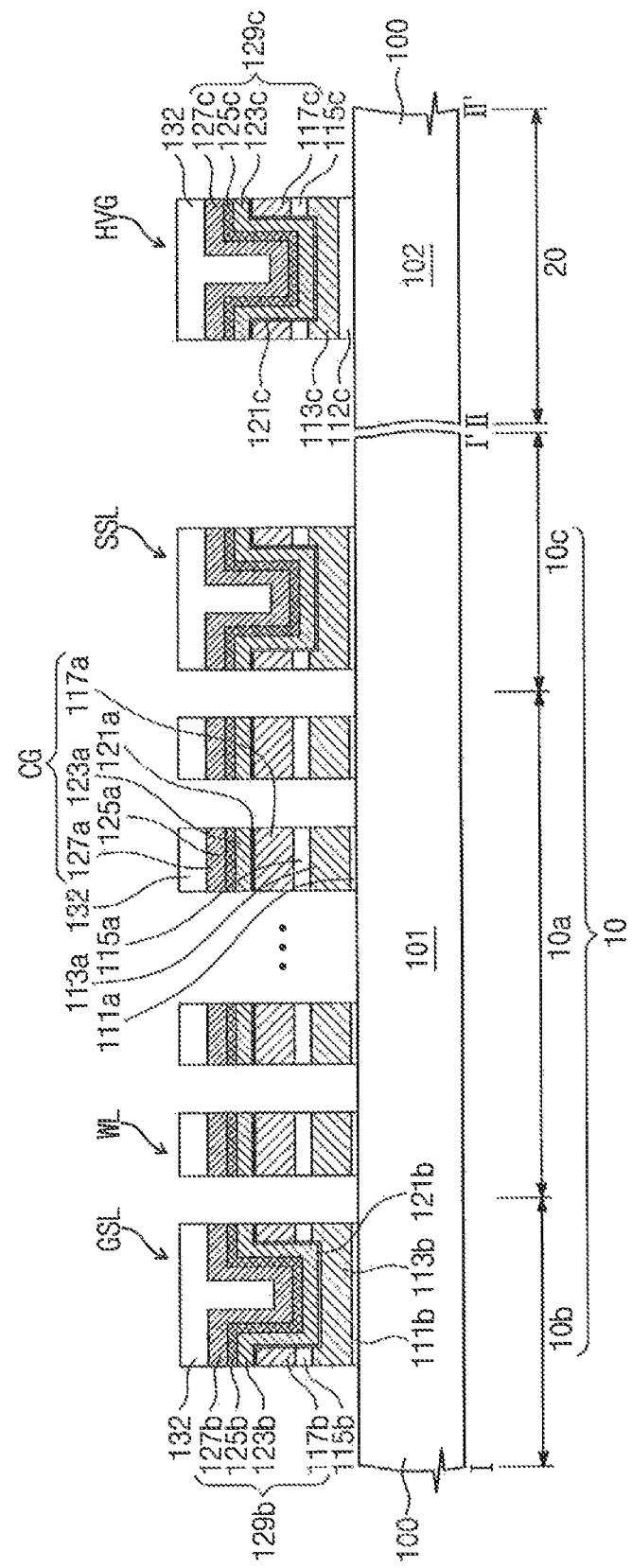

SEMICONDUCTOR DEVICES AND METHODS OF FABRICATING THE SAME

CROSS-REFERENCE TO RELATED APPLICATIONS

Korean Patent Application No. 10-2012-0076213, filed on Jul. 12, 2012, in the Korean Intellectual Property Office, and entitled: "SEMICONDUCTOR DEVICES AND METHODS OF FABRICATING THE SAME," is incorporated by reference herein in its entirety.

BACKGROUND

1. Field

Example embodiments relate to semiconductor devices and methods of fabricating the same.

2. Description of the Related Art

Generally, semiconductor memory devices may be classified into a volatile memory devices and non-volatile memory devices. The non-volatile memory device includes non-volatile memory cells capable of preserving stored data without a power supply.

A nonvolatile memory device retains stored data even when power supply is cut off and includes a Programmable ROM (PROM), an Erasable PROM (EPROM), an Electrically [Erasable] EPROM (EEPROM), and a flash memory device, among others. A flash memory device electrically programs and erases data using Fowler-Nordheim (FN) tunneling or channel hot electron injection. A flash memory device may have memory cells of various types and may be classified into a NAND type or a NOR type based on a cell array structure. In addition, the flash memory device may be divided into floating-gate-type flash memory device or a charge-trap-type flash memory device according to kind of a memory storage layer constituting a unit cell,

SUMMARY

Embodiments are directed to a semiconductor device including a lower insulating pattern on a semiconductor substrate, a lower gate pattern on the lower insulating pattern and formed of a doped polysilicon layer, a residual insulating pattern with an opening exposing a portion of a top surface of the lower gate pattern, an upper gate pattern on the residual insulating pattern, the upper gate pattern filling the opening, and a diffusion barrier pattern in contact with the portion of the top surface of the lower gate pattern and extending between the residual insulating pattern and the upper gate pattern.

The diffusion barrier pattern may be formed of silicon oxide, silicon oxynitride, or silicon nitride.

The diffusion barrier pattern may have a thickness ranging from about 1 Å to about 15 Å.

The upper gate pattern may include a first upper polysilicon pattern, a barrier metal pattern, and a metal pattern, sequentially stacked on the substrate.

A bottommost surface of the first upper polysilicon pattern may be lower than a bottommost surface of the residual insulating pattern.

The upper gate pattern may further include a second upper polysilicon pattern between the residual insulating pattern and the diffusion barrier pattern.

The upper gate pattern may further include a second upper polysilicon pattern between the diffusion barrier pattern and the first upper polysilicon pattern.

A bottommost surface of the first upper polysilicon pattern may be higher than a bottommost surface of the residual insulating pattern. A bottommost surface of the second upper polysilicon pattern is lower than a bottom surface of the residual insulating pattern.

The second upper polysilicon pattern may be thicker than the first upper polysilicon pattern.

Embodiments are also directed to a method of fabricating a semiconductor device including sequentially stacking a tunnel insulating layer and a floating gate layer on a semiconductor substrate, forming an inter-gate insulating layer on the floating gate layer to have an opening exposing a portion of the floating gate layer, forming a diffusion barrier layer on the inter-gate insulating layer to conformally cover an inner surface of the opening, forming an upper gate layer to fill the opening provided with the diffusion barrier layer, the upper gate layer including a metal material, and patterning the upper gate layer, the diffusion barrier layer, the inter-gate insulating layer, the floating gate layer, and the tunnel insulating layer to form a gate electrode.

The diffusion barrier layer may be formed using an annealing process, a deposition process, or a native-oxide formation process.

The diffusion barrier layer may include a silicon oxide layer, a silicon oxynitride layer, or a silicon nitride layer.

The diffusion barrier layer may be formed to have a thickness ranging from about 1 Å to about 15 Å.

Forming the opening may include recessing a portion of a top surface of the floating gate layer.

Forming the upper gate layer may include sequentially stacking a first polysilicon layer, a barrier metal layer, and a metal layer.

Embodiments are also directed to a semiconductor device including a cell array region including a plurality of cell gate electrodes, a ground selection electrode, and a string selection electrode, and a peripheral region including a high-voltage gate electrode. The cell gate electrodes each include a tunnel insulating pattern, a floating gate pattern, an inter-gate insulating pattern and a control gate pattern sequentially stacked on a substrate, the control gate pattern including a first polysilicon pattern, a first diffusion barrier pattern, a second polysilicon pattern and a first metal pattern sequentially stacked on the inter-gate insulating pattern, a first barrier metal being interposed between the second polysilicon pattern and the first metal pattern. The ground selection electrode, string selection electrode, and high-voltage gate electrode each include a lower insulating pattern on the substrate, a lower gate pattern on the lower insulating pattern and formed of a doped polysilicon layer, a residual insulating pattern with an opening exposing a portion of a top surface of the lower gate pattern, an upper gate pattern on the residual insulating pattern, the upper gate pattern filling the opening, and a second diffusion barrier pattern in contact with the portion of the top surface of the lower gate pattern and extending between the residual insulating pattern and the upper gate pattern.

The first diffusion barrier pattern and the second diffusion barrier pattern may be each formed of a silicon oxide layer, a silicon oxynitride layer, or a silicon nitride layer and each have a thickness ranging from about 1 Å to about 15 Å.

The upper gate pattern of the ground selection electrode, string selection electrode, and high-voltage gate electrode may include a first upper polysilicon pattern, a barrier metal pattern, and a metal pattern, sequentially stacked on the substrate.

A bottommost surface of the first upper polysilicon pattern may be lower than a bottommost surface of the residual insulating pattern.

The upper gate pattern may further include a second upper polysilicon pattern between the diffusion barrier pattern and the first upper polysilicon pattern. A bottommost surface of the first upper polysilicon pattern may be higher than a bottommost surface of the residual insulating pattern. A bottommost surface of the second upper polysilicon pattern may be lower than a bottom surface of the residual insulating pattern.

BRIEF DESCRIPTION OF THE DRAWINGS

Features will become apparent to those of ordinary skill in the art by describing in detail exemplary embodiments with reference to the attached drawings in which:

FIG. 4 illustrates a sectional view of a semiconductor device according to other example embodiments, taken along lines I-I' and II-II' of FIG. 1.

FIGS. 8A through 8F illustrate sectional views showing stages of a method of fabricating a semiconductor device according to example embodiments.

DETAILED DESCRIPTION

Figure 1:
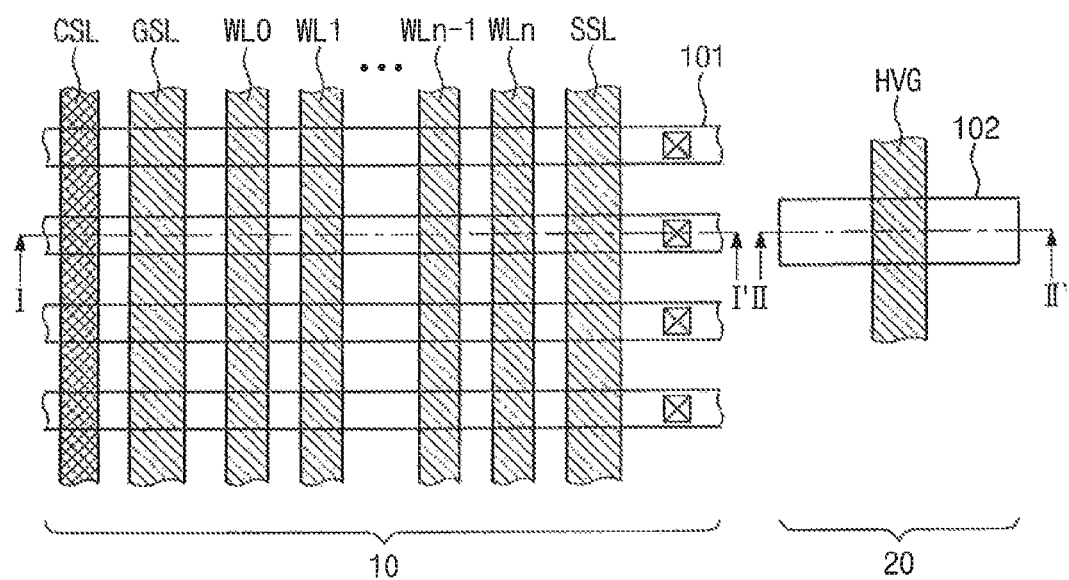
FIG. 1 illustrates a plan view of a semiconductor device according to example embodiments.

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
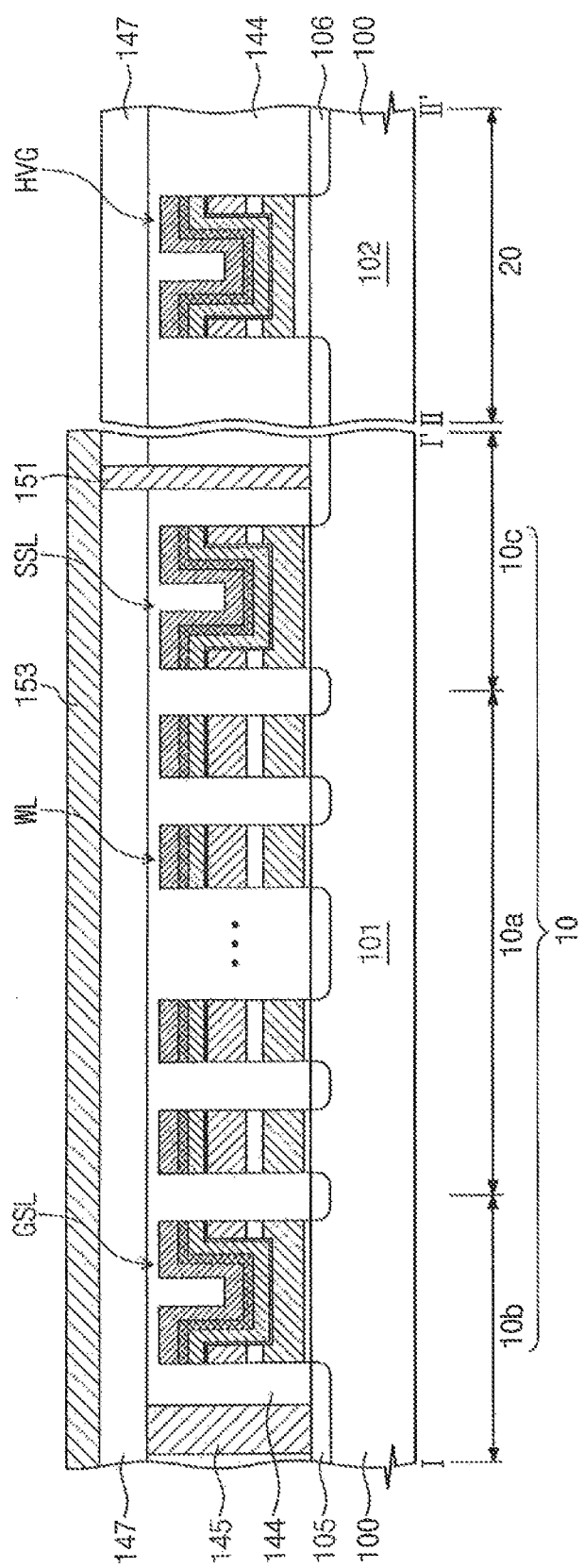
FIG. 2 illustrates a sectional view of a semiconductor device according to example embodiments, taken along lines I-I' and II-II' of FIG. 1.

FIG. 1 illustrates a plan view of a semiconductor device according to example embodiments. FIG. 2 is a sectional view illustrating a semiconductor device according to example embodiments, taken along lines I-I' and II-II' of FIG. 1, and FIGS. 3A through 3C are enlarged sectional views of gate electrodes of FIG. 2.

Referring to FIGS. 1, 2, and 3A through 3C, a semiconductor substrate 100 may include a cell array region 10 and a peripheral circuit region 20.

The semiconductor substrate 100 may be a silicon wafer. The cell array region 10 may include a cell region 10a and first and second selection regions 10b and 10c provided at both sides of the cell region 10a, respectively.

In example embodiments, NAND FLASH memory cells may be provided on the cell array region 10. For example, cell gate electrodes WL may be provided on the cell region 10a, while a ground selection gate electrode GSL and a string selection gate electrode SSL may be provided on the first and the second selection regions 10b and 10c, respectively. A peripheral circuit or transistor may be provided on the peripheral circuit region 20.

The cell array region 10 may include first active regions 101. The peripheral circuit region 20 may include a second active region 102. The first active regions 101 and the second active region 102 may be formed to have plan shapes different from each other. The first active regions 101 and the second active region 102 may be portions of the semiconductor substrate 100 surrounded by a device isolation layer (not shown).

The cell gate electrodes WL, the string and ground selection gate electrodes SSL and GSL may be arranged on the cell array region 10 to cross the first active regions 101. A low-voltage gate electrode (not shown) or a high-voltage gate electrode HVG may be provided on the peripheral circuit region 20 to cross the second active region 102.

First source/drain regions 105 may be provided in the first active region 101 and at both sides of each of the cell gate electrodes WL and the ground and string selection gate electrodes GSL and SSL. In other implementations, the first source/drain region 105 may be omitted between the cell gate electrodes WL. Second source/drain regions 106 may be provided in portions of the second active region 102, which are located at both sides of the high-voltage gate electrode HVG.

Figure 3A:
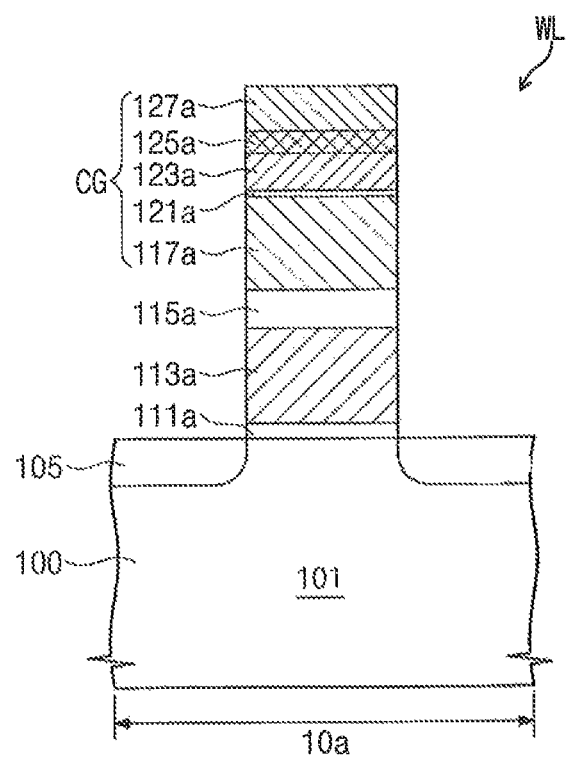
FIGS. 3A through 3C illustrate enlarged sectional views of gate electrodes of FIG. 2.

A plurality of the gate electrodes WL may be arranged parallel to each other, in substantially equal intervals, on the cell region 10a. As shown in FIG. 3A, each of the gate electrodes WL may include a tunnel insulating pattern 111a, a floating gate pattern 113a, and inter-gate insulating pattern 115a, and a control gate pattern CG, which are sequentially stacked on the semiconductor substrate 100. Further, the control gate pattern CG may include a first polysilicon pattern 117a, a first diffusion barrier pattern 121a, a second polysilicon pattern 123a, and a first metal pattern 127a, which are sequentially stacked on the inter-gate insulating pattern 115a. A first barrier metal pattern 125a may be further disposed between the second polysilicon pattern 123a and the first metal pattern 127a.

In example embodiments, the tunnel insulating pattern 111a may include a silicon oxide layer. For example, the tunnel insulating pattern 111a may be formed by a thermal oxidation. The tunnel insulating pattern 111a may be configured in such a way that electric charges from the semiconductor substrate 100 can be injected into the floating gate pattern 113a through FN tunneling, during a program operation.

The floating gate pattern 113a may be formed of a p- or n-type polysilicon layer. In the p-type case, the floating gate pattern 113a may be doped with impurities such as boron, aluminum, and gallium. In the n-type case, the floating gate pattern 113a may be doped with impurities such as phosphorus, arsenic, bismuth, or antimony. The floating gate pattern 113a may be electrically isolated from other conductive patterns. Electric charges stored therein may be preserved even in the case that no power is supplied to the device.

The inter-gate insulating pattern 115a may separate the floating gate pattern 113a electrically from the control gate pattern CG. In example embodiments, the inter-gate insulating pattern 115a may include an oxide layer having a thickness greater than that of the tunnel insulating pattern 111a. In other embodiments, the inter-gate insulating pattern 115a may be provided in the form of a multi-layered structure, in which a lower oxide, a nitride layer, and an upper oxide layer are sequentially stacked. Furthermore, the inter-gate insulating pattern 115a may include a high-k dielectric, for example, having a dielectric constant higher than that of the tunnel insulating pattern 111a. For example, insulating metal oxides, such as hafnium oxide or aluminum oxide may be used as the high-k dielectric for the inter-gate insulating pattern 115a.

The first and second polysilicon patterns 117a and 123a may be doped to become a p- or n-type. In example embodiments, the first and second polysilicon patterns 117a and 123a may be doped with impurities of the same kind to have the same conductivity type. The first polysilicon pattern 117a may be formed to have a thickness greater than that of the second polysilicon pattern 123a.

The first diffusion barrier pattern 121a may be interposed between the first and second polysilicon patterns 117a and 123a. In example embodiments, the first diffusion barrier pattern 121a may include at least one of a silicon oxide layer, a silicon oxynitride layer, or a silicon nitride layer. The first diffusion barrier pattern 121a may be formed to have a thickness in a range from about 1 Å to about 15 Å. The first diffusion barrier pattern 121a may have a very thin thickness. Accordingly, the first polysilicon pattern 117a and the second polysilicon pattern 123a may be electrically connected to each other. For example, the first polysilicon pattern 117a and the second polysilicon pattern 123a may have substantially the same potential.

In example embodiments, the first metal pattern 127a may include a tungsten layer or a molybdenum layer.

The first barrier metal pattern 125a disposed between the second polysilicon pattern 123a and the first metal pattern 127a may include at least one conductive metal nitride layer, such as, a tungsten nitride layer (WN), a molybdenum nitride layer (MoN), a titanium nitride layer (TiN), or a tantalum nitride layer (TaN).

Referring back to FIG. 2, the ground selection gate electrode GSL may be provided on the first selection region 10b, and the string selection gate electrode SSL may be provided on the second selection region 10c. In example embodiments, the ground selection gate electrode GSL may be configured to have the substantially same layer structure as that of the string selection gate electrode SSL. Accordingly, for the sake of brevity, only a structure of the ground selection gate electrode GSL will be described below, and such description may be considered to be substantially applicable to the string selection gate electrode SSL as well.

Figure 3B:
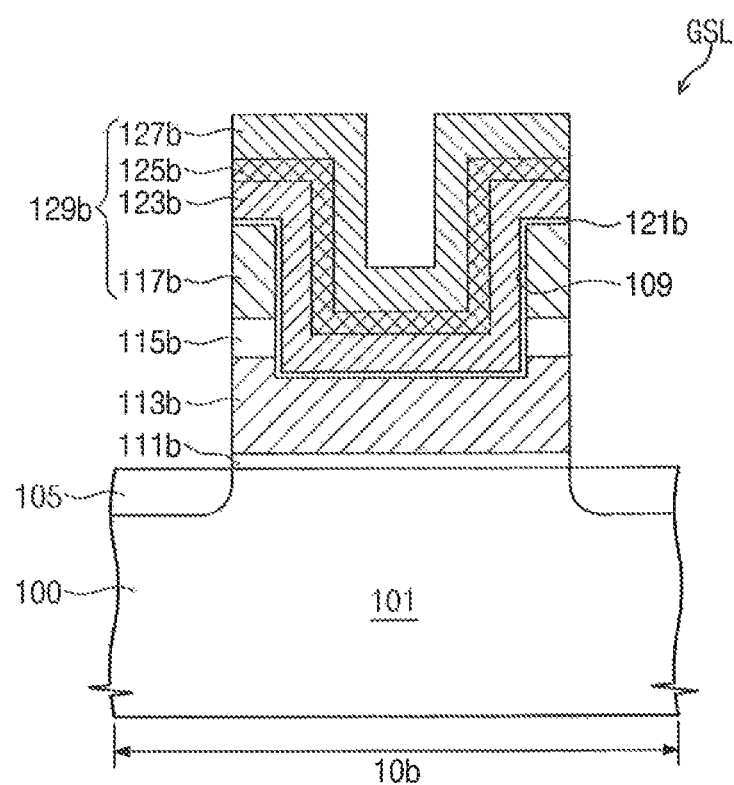

Referring to FIG. 3B, the ground selection gate electrode GSL may include a lower insulating pattern 111b, a lower gate pattern 113b, a first residual insulating pattern 115b, and an upper gate pattern 129b that are sequentially stacked on the semiconductor substrate 100. The upper gate pattern 129b may include a first upper polysilicon pattern 117b, a second diffusion barrier pattern 121b, a second upper polysilicon pattern 123b, and a second metal pattern 127b. A second barrier metal pattern 125b may be further disposed between the second upper polysilicon pattern 123b and the second metal pattern 127b. The second barrier metal pattern 125b may be a portion of the upper gate pattern 129b.

In example embodiments, the lower insulating pattern 111b may be formed to have the substantially same material and thickness as those of the tunnel insulating pattern 111a.

The lower gate pattern 113b, the first residual insulating pattern 115b, and the first upper polysilicon pattern 117b of the ground selection gate electrode GSL may be configured to have the same stacking structure as the floating gate pattern 113a, the inter-gate insulating pattern 115a, and the first polysilicon pattern 117a of the cell gate electrode WL. In example embodiments, the first upper polysilicon pattern 117b may have a top surface that is coplanar with a top surface of the first polysilicon pattern 117a.

The upper gate pattern 129b may be formed to penetrate the first upper polysilicon pattern 117b and the first residual insulating pattern 115b. Further, a top surface of the lower gate pattern 113b may be recessed by an opening 109, in which the upper gate pattern 129b is provided.

The second diffusion barrier pattern 121b may be disposed on the first upper polysilicon pattern 117b having the opening 109 to cover an inner surface of the opening 109. In example embodiments, a bottommost surface of the second diffusion barrier pattern 121b may be located below, for example, lower than, a bottommost surface of the first residual insulating pattern 115b and be in contact with the lower gate pattern 113b. The second diffusion barrier pattern 121b may have a very thin thickness. Accordingly, the lower gate pattern 113b and the upper gate pattern 129b may be electrically connected to each other. The second diffusion barrier pattern 121b may be formed to have the substantially same material and thickness as the material and thickness of the first diffusion barrier pattern 121a.

The second upper polysilicon pattern 123b, the second barrier metal pattern 125b, and the second metal pattern 127b may extend into the opening 109 along with the second diffusion barrier pattern 121b. A bottommost surface of the second upper polysilicon pattern 123b may be located below, for example, lower than, the bottommost of the first residual insulating pattern 115b. The first upper polysilicon pattern 117b may be formed to have a thickness greater than that of the second upper polysilicon pattern 123b.

Each of the second upper polysilicon pattern 123b, the second barrier metal pattern 125b, and the second metal pattern 127b of the ground selection gate electrode GSL may be formed to have the substantially same thickness as the corresponding one of the second polysilicon pattern 123a, the first barrier metal pattern 125a, and the first metal pattern 127a of the gate electrodes WL.

In example embodiments, when a total deposition thickness of the second upper polysilicon pattern 123b, the second barrier metal pattern 125b, and the second metal pattern 127b is smaller than half a width of the opening 109, the opening 109 may not be completely filled with the second upper polysilicon pattern 123b, the second barrier metal pattern 125b, and the second metal pattern 127b. In this case, the unoccupied space of the opening 109 may be filled with a hard-mask pattern (not shown) that will be formed in a subsequent deposition process.

According to example embodiments, the second diffusion barrier pattern 121b may contribute to prevent or hinder impurities, which are contained in the lower gate pattern 113b (e.g., of doped polysilicon), from being diffused into the upper gate pattern 129b containing a metal material. Accordingly, it may be possible to prevent or hinder a change in doping concentration of the lower gate pattern 113b. Furthermore, it may be possible to prevent the interfacial resistance between the lower and upper gate patterns 113b and 129b from increasing. The second diffusion barrier pattern 121b may prevent or hinder impurities from being diffused into the upper gate pattern 129b, as described above.

Figure 3C:
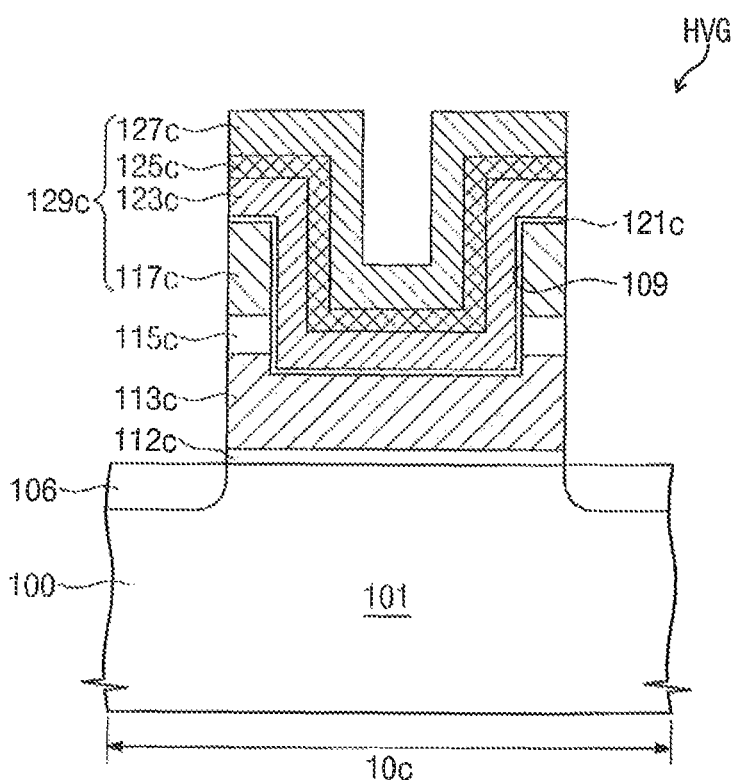

Referring to FIGS. 2 and 3C, the high-voltage gate electrode HVG may be formed in the peripheral circuit region 20. In example embodiments, the high-voltage gate electrode HVG may be formed to have the substantially same stacking structure as that of the ground selection gate electrode GSL and/or the string selection gate electrode SSL.

The high-voltage gate electrode HVG may include a high-voltage lower insulating pattern 112c, a lower gate pattern 113c, a second residual insulating pattern 115c, a first upper polysilicon pattern 117c, a third diffusion barrier pattern 121c, a second upper polysilicon pattern 123c, and a third metal pattern 127c, that are sequentially stacked on the semiconductor substrate 100. In example embodiments, the first upper polysilicon pattern 117c, the second upper polysilicon pattern 123c, and third metal pattern 127c may constitute an upper gate pattern 129c. A third barrier metal pattern 125c may be further disposed between the second upper polysilicon pattern 123c and the third metal pattern 127c.

The high-voltage lower insulating pattern 112c may be formed to have a thickness greater than the thicknesses of the tunnel insulating pattern 111a and the lower insulating pattern 111b. Accordingly, the high-voltage lower insulating pattern 112c may be used as a gate insulator of a high-voltage transistor, to which a high voltage is applied. Although not shown in the drawings, a low-voltage transistor may be provided in the second active region 102. In this case, the low-voltage transistor may include a gate insulator having a thickness suitable for a low-voltage operation.

The lower gate pattern 113c of the high-voltage gate electrode HVG may be formed to have the same material as the lower gate pattern 113b of the ground selection gate electrode GSL. Further, the lower gate pattern 113c of the high-voltage gate electrode HVG may have a top surface that is coplanar with that of the lower gate pattern 113b of the ground selection gate electrode GSL.

Referring back to FIG. 2, a lower interlayered dielectric 144 and an upper interlayered dielectric 147 may be sequentially stacked on the semiconductor substrate 100 to cover the gate electrodes WL, GSL, SSL, and HVG. The lower interlayered dielectric 144 may be formed to cover completely the gate electrodes WL, GSL, SSL, and HVG.

A common source line CSL (identified by reference character 145 in FIGS. 2, 4, and 6) may be further provided on the first selection region 10b to penetrate the lower interlayered dielectric 144. The common source line CSL (145) may be disposed spaced apart from the ground selection gate electrode GSL. The common source line CSL may be formed to connect a plurality of the first source/drain regions 105, which are arranged along the ground selection gate electrode GSL, to each other.

A bit line 153 may be provided on the cell array region 10. For example, the bit line 153 may be provided on the upper interlayered dielectric 147. In addition, a bit line contact plug 151 may be formed through the upper interlayered dielectric 147 and the lower interlayered dielectric 144 to connect the bit line 153 to the corresponding one of the first source/drain regions 105. For example, the bit line contact plug 151 may be connected to the first source/drain region 105 adjacent to the string selection gate electrode SSL. The bit line 153 may be electrically connected to the first source/drain region 105 via the bit line contact plug 151.

Figure 5:
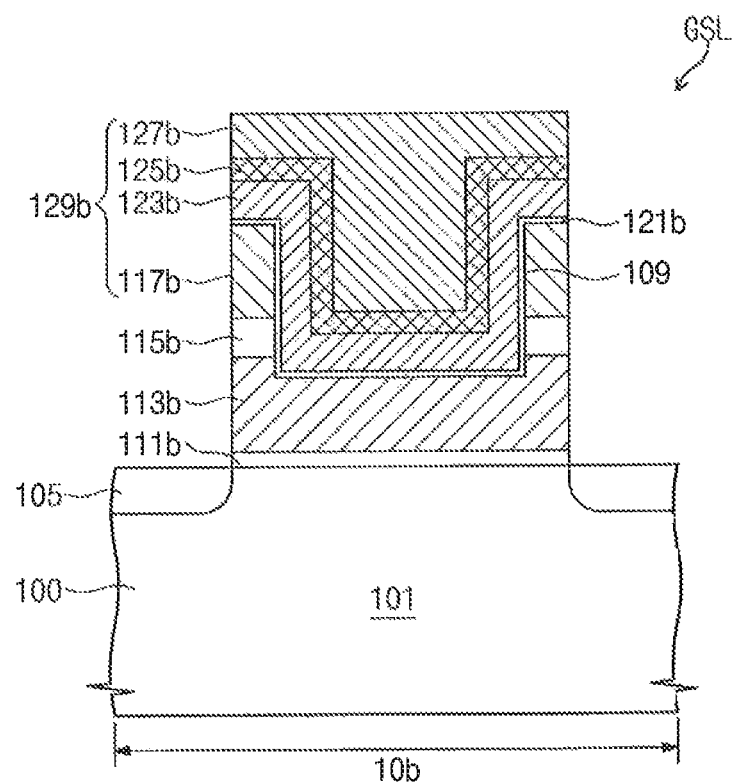
FIG. 5 illustrates an enlarged sectional view of a ground selection gate electrode of FIG. 4.

FIG. 4 illustrates a sectional view, taken along lines I-I' and II-II' of FIG. 1, illustrating a semiconductor device according to other example embodiments. FIG. 5 is an enlarged sectional view of a ground selection gate electrode of FIG. 4.

For the sake of brevity, the elements and features of this example that are similar to those previously shown and described will not be described in much further detail.

Referring to FIGS. 4 and 5, when a total deposition thickness of the second upper polysilicon pattern 123b, the second barrier metal pattern 125b, and the second metal pattern 127b is greater than half a width of the opening 109, the opening 109 may be fully filled with the second upper polysilicon pattern 123b, the second barrier metal pattern 125b, and the second metal pattern 127b.

The string selection electrode SSL and the high-voltage gate electrode HVG may be configured to have the substantially same stacking structure as that of the ground selection gate electrode GSL.

Figure 6:
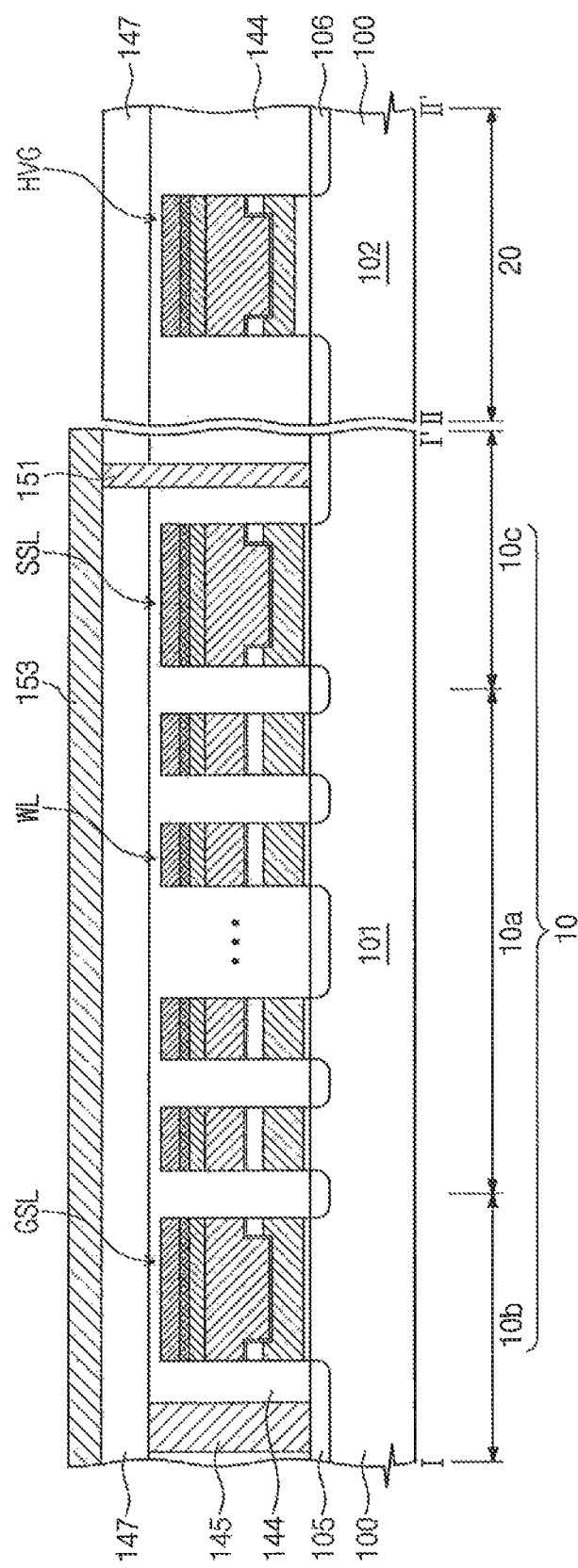
FIG. 6 illustrates a sectional view of a semiconductor device according to other example embodiments, taken along lines I-I' and II-II' of FIG. 1.
Figure 7:
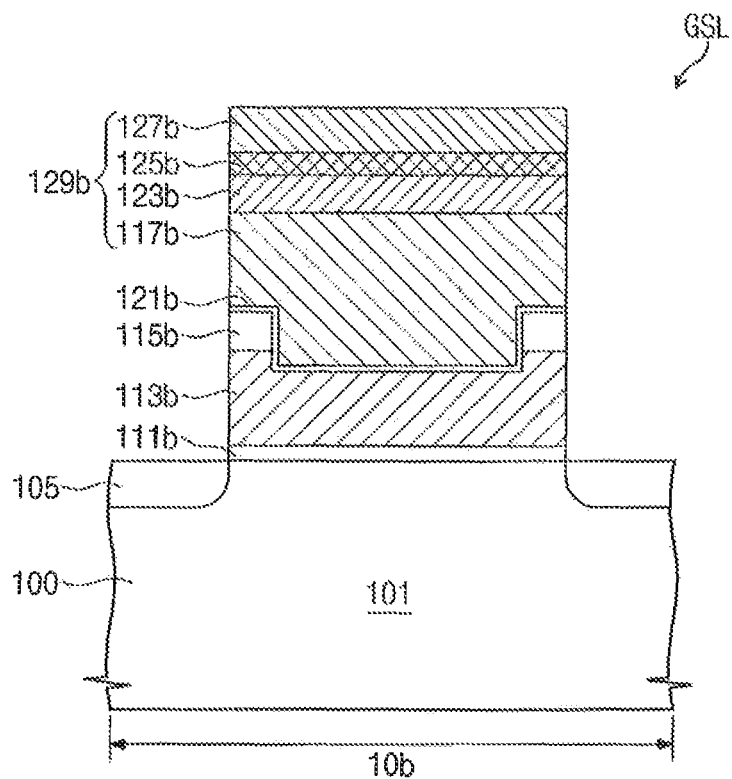
FIG. 7 illustrates an enlarged sectional view of a ground selection gate electrode of FIG. 6.

FIG. 6 illustrates a sectional view, taken along lines I-I' and II-II' of FIG. 1 illustrating a semiconductor device according to other example embodiments. FIG. 7 is an enlarged sectional view of a ground selection gate electrode of FIG. 6.

For the sake of brevity, the elements and features of this example that are similar to those previously shown and described will not be described in much further detail.

Referring to FIGS. 6 and 7, the ground selection gate electrode GSL may include the lower insulating pattern 111b, the lower gate pattern 113b, the first residual insulating pattern 115b, the second diffusion barrier pattern 121b, and the upper gate pattern 129b that are sequentially stacked on the semiconductor substrate 100. The upper gate pattern 129b may include the first upper polysilicon pattern 117b, the second upper polysilicon pattern 123b, and the second metal pattern 127b. The second barrier metal pattern 125b may be further disposed between the second upper polysilicon pattern 123b and the second metal pattern 127b. The second barrier metal pattern 125b may be a portion of the upper gate pattern 129b.

In the present embodiment, the second diffusion barrier pattern 121b may be in contact with the lower gate pattern 113b through the lower gate pattern 113b and the first upper polysilicon pattern 117b. The first upper polysilicon pattern 117b provided on the diffusion barrier pattern 121b may have a bottommost surface that is positioned below, for example, lower than the bottommost surface of the first residual insulating pattern 115b.

The string selection electrode SSL and the high-voltage gate electrode HVG may be configured to have the substantially same stacking structure as that of the ground selection gate electrode GSL.

FIGS. 8A through 8F illustrate sectional views showing stages of a method of fabricating a semiconductor device according to example embodiments.

Figure 8A:
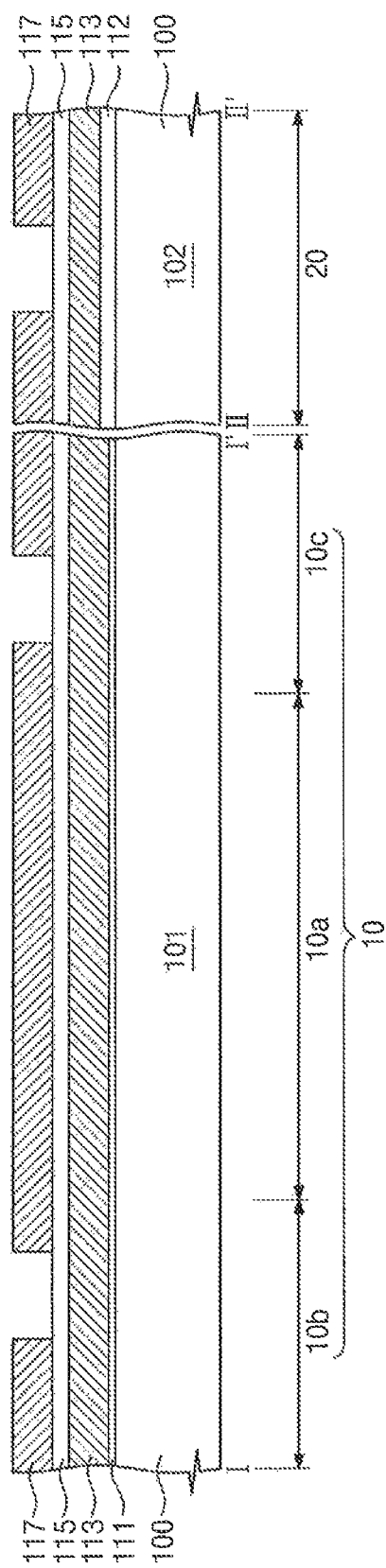

Referring to FIG. 8A, a semiconductor substrate 100 may be provided. The semiconductor substrate 100 may include the cell array region 10 and the peripheral circuit region 20. The cell array region 10 may include the cell region 10a and the first and second selection regions 10b and 10c provided at both sides of the cell region 10a, respectively. The semiconductor substrate 100 may be a silicon wafer. The cell array region 10 may include the first active region 101. The peripheral circuit region 20 may include the second active region 102. The first and the second active regions 101 and 102 may be portions of the semiconductor substrate 100 surrounded by a device isolation layer (not shown).

A tunnel insulating layer 111 may be formed on the cell array region 10 of the semiconductor substrate 100. The tunnel insulating layer 111 may include a silicon oxide layer. For example, the tunnel insulating layer 111 may be formed by a thermal oxidation process.

A high-voltage lower insulating layer 112 may be formed on the peripheral circuit region 20 of the semiconductor substrate 100. The high-voltage lower insulating layer 112 may be formed before or after the formation of the tunnel insulating layer 111. The high-voltage lower insulating layer 112 may be formed to have a thickness equivalent to or different from that of the tunnel insulating layer 111. In example embodiments, the high-voltage lower insulating layer 112 may be formed to be thicker than the tunnel insulating layer 111. The high-voltage lower insulating layer 112 may be a silicon oxide layer. The high-voltage lower insulating layer 112 may be formed by, for example, a thermal oxidation process.

A floating gate layer 113 may be formed on the tunnel insulating layer 111 and the high-voltage lower insulating layer 112. The floating gate layer 113 may be formed using one of a chemical vapor deposition process, a physical vapor deposition process, or an atomic layer deposition process. The floating gate layer 113 may be formed of a polysilicon layer. The floating gate layer 113 may be doped with impurities, such as, boron or phosphorus. For example, the doping of the floating gate layer 113 may be performed by an ion implantation process or an impurity diffusion process.

An inter-gate insulating layer 115 may be formed on the floating gate layer 113. The inter-gate insulating layer 115 may be formed using one of a chemical vapor deposition, a physical vapor deposition, or an atomic layer deposition. The inter-gate insulating layer 115 may include an oxide layer having a thickness greater than that of the tunnel insulating layer 111. In other embodiments, the inter-gate insulating layer 115 may include an ONO layer formed by sequentially stacking a lower oxide, a nitride layer, and an upper oxide layer. Furthermore, the inter-gate insulating layer 115 may include a high-k dielectric having, for example, a dielectric constant higher than that of the tunnel insulating pattern 111a. For example, insulating metal oxides, such as hafnium oxide or aluminum oxide may be used as the high-k dielectric for the inter-gate insulating layer 115.

A first polysilicon layer 117 may be formed on the inter-gate insulating layer 115. The first polysilicon layer 117 may be formed such that the inter-gate insulating layer 115 is exposed on the first and the second selection regions 10a and 10b and on a portion of the peripheral circuit region 20.

Accordingly, the first polysilicon layer 117 may be formed to have openings exposing the inter-gate insulating layer 115 on the first and second selection regions 10a and 10b. The first polysilicon layer 117 may be formed by one of a chemical vapor deposition process, a physical vapor deposition process, or an atomic layer deposition process.

Figure 8B:
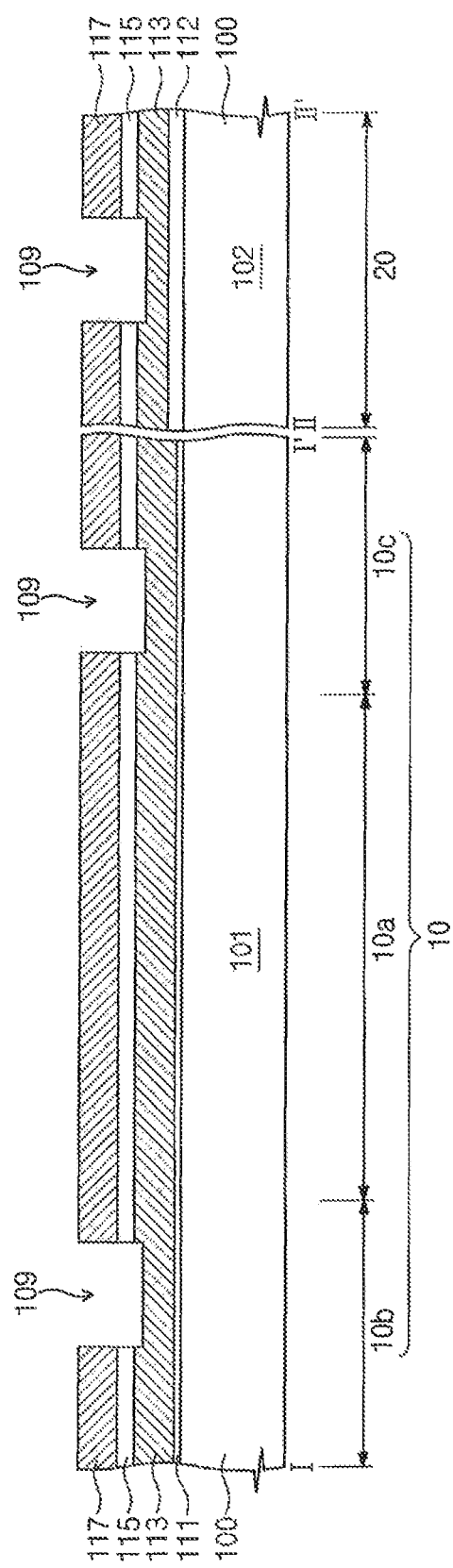

Referring to FIG. 8B, the inter-gate insulating layer 115 may be etched using the first polysilicon layer 117 as an etch mask, thereby forming the opening 109.

For example, the formation of the opening 109 may include anisotropically etching the inter-gate insulating layer 115 exposed by the first polysilicon layer 117. The opening 109 may be locally formed on the first and second selection regions 10b and 10c and the peripheral circuit region 20. In example embodiments, the floating gate layer 113 exposed by the opening 109 may be partially recessed during the anisotropic etching process.

Figure 8C:
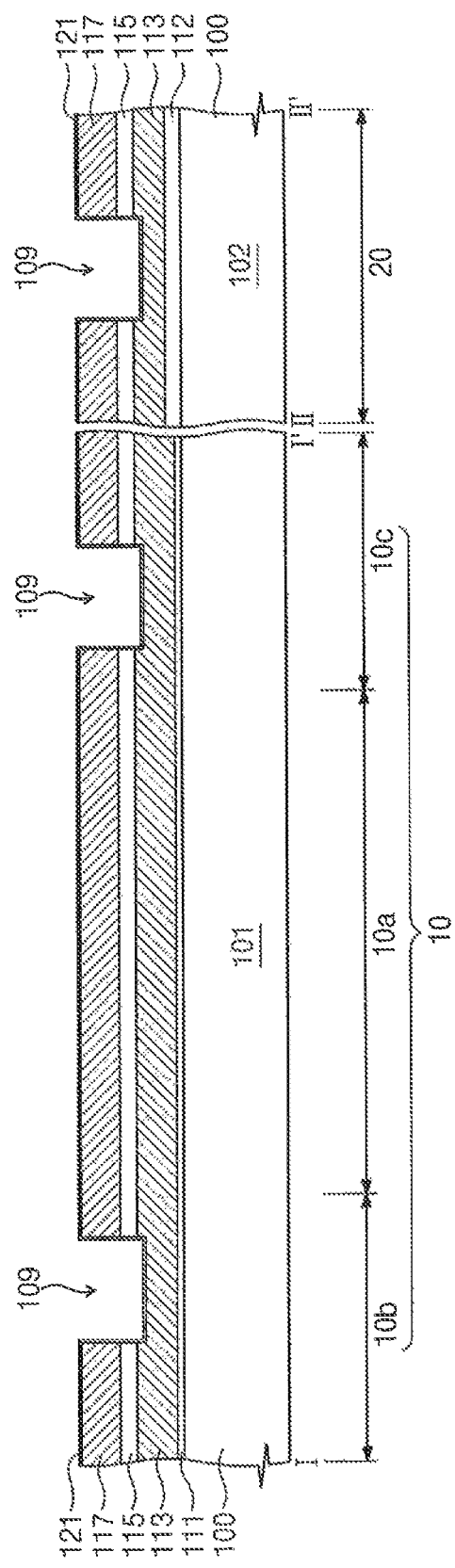

Referring to FIG. 8C, a diffusion barrier layer 121 may be formed to conformally cover bottom and side surfaces of the opening 109 and a top surface of the first polysilicon layer 117.

The diffusion barrier layer 121 may include at least one a silicon oxide layer, a silicon oxynitride layer, or a silicon nitride layer. In example embodiments, the diffusion barrier layer 121 may be formed to have a thickness ranging from about 1 Å to about 15 Å.

In example embodiments, the diffusion barrier layer 121 may be formed by an annealing step, which may be performed using at least one gas of $O_2$, $O_2/N_2$ or $O_2/N_2O$. The annealing process may be performed at a temperature of about 300° C. to about 700° C. In the case where the annealing process is performed, a cleaning process on the semiconductor substrate 100 may be omitted. In other embodiments, the diffusion barrier layer 121 may be formed by a deposition process, such as, an atomic layer deposition process, a chemical vapor deposition process, or a diffusion process. In the case where the diffusion barrier layer 121 is formed by the deposition process, a cleaning process on the semiconductor substrate 100 may be omitted.

In still other embodiments, the diffusion barrier layer 121 may be a native oxide layer. In this case, a cleaning process on the semiconductor substrate 100 may be omitted.

Figure 8D:
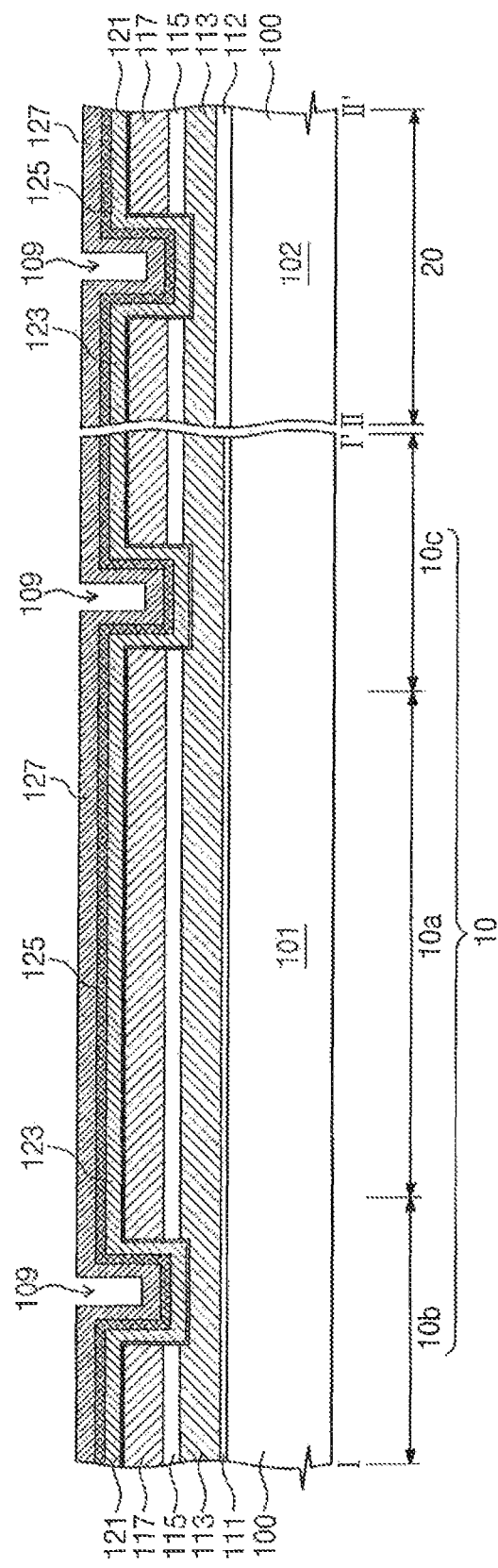

Referring to FIG. 8D, a second polysilicon layer 123, a barrier metal layer 125, and a metal layer 127 may be sequentially formed on the diffusion barrier layer 121.

At least one of the second polysilicon layer 123, the barrier metal layer 125, and the metal layer 127 may be formed by a chemical vapor deposition process, a physical vapor deposition process, or an atomic layer deposition process. In the case where a total deposition thickness of the second polysilicon layer 123, the barrier metal layer 125, and the metal layer 127 is smaller than half a width of the opening 109, the opening 109 may not be fully filled with the second polysilicon layer 123, the barrier metal layer 125, and the metal layer 127. In the case where the total deposition thickness is greater than half a width of the opening 109, the opening 109 may be fully filled with the second polysilicon layer 123, the barrier metal layer 125, and the metal layer 127, as shown in FIG. 5.

The barrier metal layer 125 may include at least one conductive metal nitride layer, such as a tungsten nitride layer, a molybdenum nitride layer, a titanium nitride layer, or a tantalum nitride layer. The metal layer 127 may include at least one metal layer such as a tungsten layer or a molybdenum layer.

Referring to FIG. 8E, hard mask patterns 132 may be formed on the metal layer 127, and the layers stacked on the semiconductor substrate 100 may be etched using the hard mask patterns 132 as an etch mask.

For example, as the result of the etching process, the cell gate electrodes WL, the ground selection gate electrode GSL, the string selection gate electrode SSL, and the high-voltage gate electrode HVG may be formed on the cell region 10a, the first selection region 10b, the second selection region 10c, and the peripheral circuit region 20, respectively.

The cell gate electrodes WL may be configured to include the tunnel insulating pattern 111a, the floating gate pattern 113a, the inter-gate insulating pattern 115a, and the control gate pattern CG. The control gate pattern CG may be configured to include the first diffusion barrier pattern 121a, the first polysilicon pattern 117a, the second polysilicon pattern 123a, the first barrier metal pattern 125a, and the first metal pattern 127a.

The ground selection gate electrode GSL may be configured to include the lower insulating pattern 111b, the lower gate pattern 113b, the first residual insulating pattern 115b, the second diffusion barrier pattern 121b, and the upper gate pattern 129b. The upper gate pattern 129b may be configured to include the first upper polysilicon pattern 117b, the second upper polysilicon pattern 123b, the second barrier metal pattern 125b, and the second metal pattern 127b. The string selection gate electrode SSL may be formed to have the same structure as that of the ground selection gate electrode GSL.

The high-voltage gate electrode HVG may be formed to have a similar structure to that of the ground and string selection gate electrodes GSL and SSL. The high-voltage gate electrode HVG may be configured to include the high-voltage lower insulating pattern 112c, the lower gate pattern 113c, the second residual insulating pattern 115c, the first upper polysilicon pattern 117c, the third diffusion barrier pattern 121c, the second upper polysilicon pattern 123c, the third barrier metal pattern 125c, and the third metal pattern 127c.

Figure 8F:
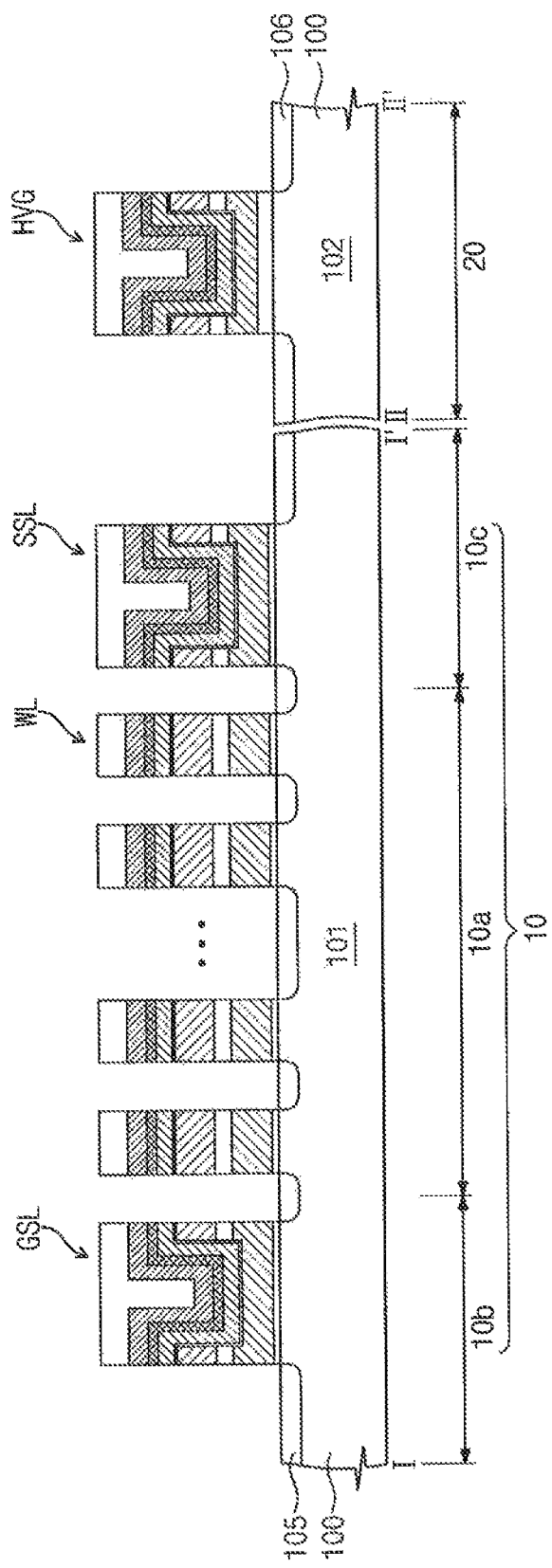

Referring to FIG. 8F, the first source/drain regions 105 and the second source/drain regions 106 may be formed in the first and second active regions 101 and 102, respectively. For example, the first and second source/drain regions 105 and 106 may be formed using the gate electrodes WL, GSL, SSL, and HVG as an ion mask.

In example embodiments, the first and second source/drain regions 105 and 106 may be formed in portions of the semiconductor substrate 100, exposed by the gate electrodes WL, GSL, SSL, and HVG, by an ion implantation process, in which the hard mask patterns 132 is used as an ion mask.

Thereafter, as shown in FIGS. 2, 4 and 6, the lower and upper interlayered dielectrics 144 and 147, the common source line 145, the bit line contact plug 151, and the bit line 153 may be formed on the semiconductor substrate 100.

Figure 9:
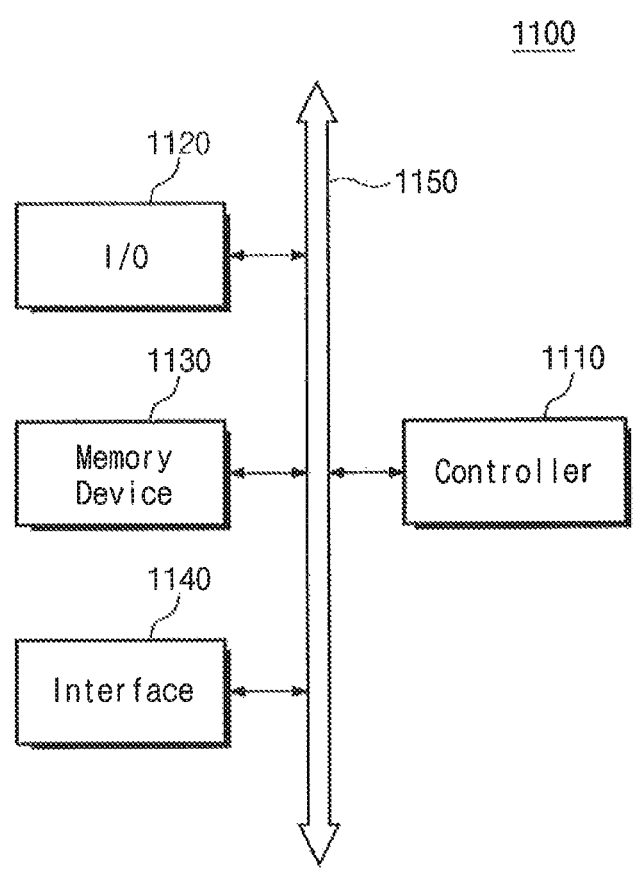
FIG. 9 illustrates a schematic block diagram showing an example of electronic systems including a semiconductor device according to example embodiments.

FIG. 9 illustrates a schematic block diagram showing an example of an electronic system including a semiconductor device according to example embodiments.

Referring to FIG. 9, an electronic system 1100 according to example embodiments may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110, the input-output unit 1120, the memory device 1130, and/or the interface 1140 may be configured to include one of semiconductor devices according to example embodiments.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Figure 10:
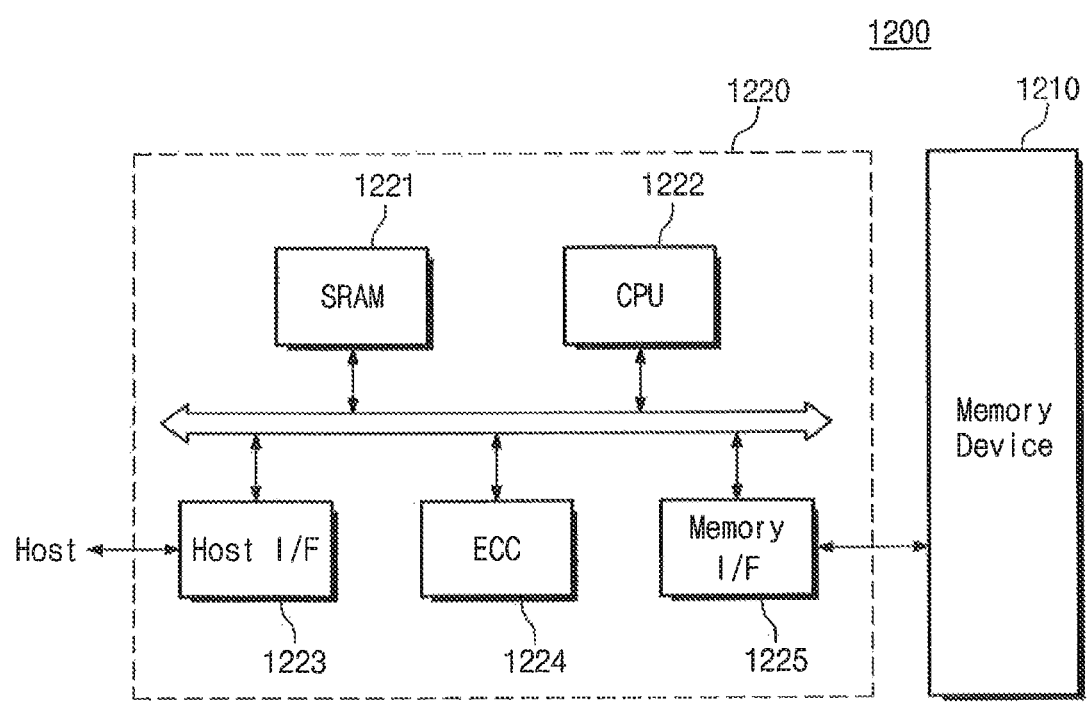
FIG. 10 illustrates a schematic block diagram showing an example of memory cards including the semiconductor memory devices according to the embodiments.

FIG. 10 illustrates a schematic block diagram showing an example of a memory card including the semiconductor memory devices according to the embodiments.

Referring to FIG. 10, a memory card 1200 according to example embodiments may include a memory device 1210. The memory device 1210 may include at least one of the semiconductor memory devices according to the afore-described embodiments. In other embodiments, the memory device 1210 may further include a semiconductor memory device, which is of a different type from the semiconductor memory devices according to the afore-described embodiments. For example, the memory device 1210 may further include a nonvolatile memory device and/or a static random access memory (SRAM) device. The memory card 1200 may include a memory controller 1220 that controls data communication between a host and the memory device 1210. The memory device 1210 and/or the memory controller 1220 may be configured to include at least one of the semiconductor devices according to example embodiments.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory card 1200 may further include a read only memory (ROM) device that stores code data to interface with the host. The memory card 1200 may be used as a portable data storage card. Alternatively, the memory card 1200 may be provided in the form of solid state disks (SSD), instead of hard disks of computer systems.

Figure 11:
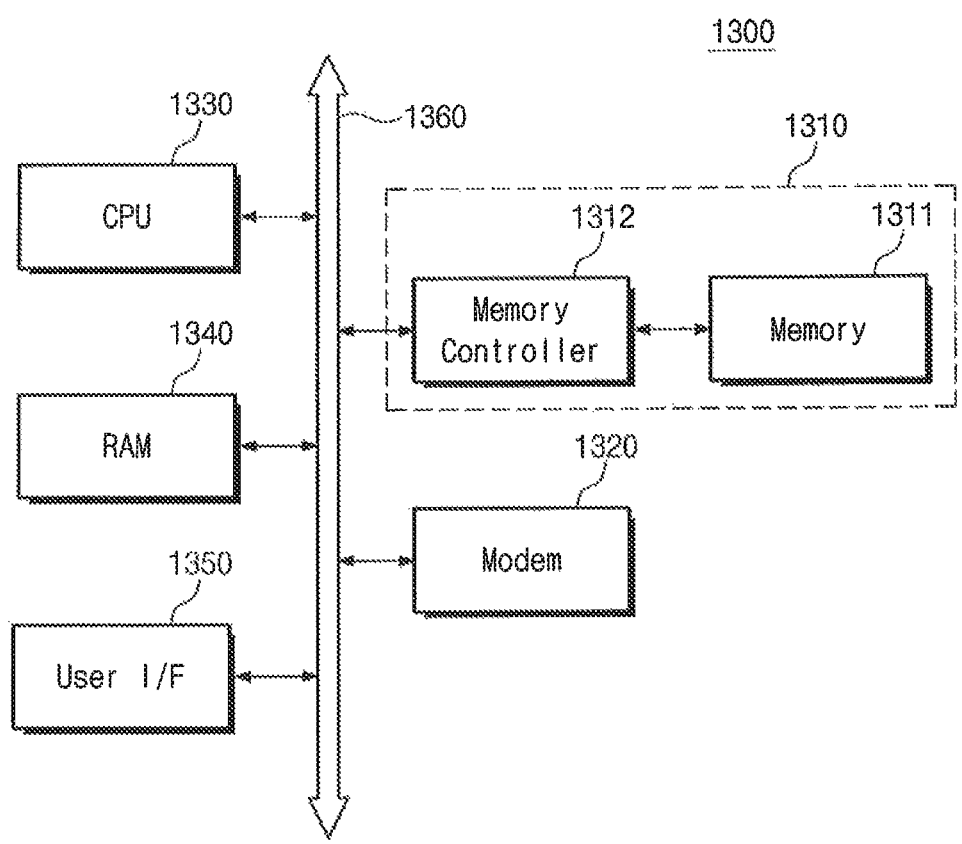
FIG. 11 illustrates a schematic block diagram showing an example of information processing systems including a semiconductor device according to example embodiments.

FIG. 11 illustrates a schematic block diagram showing an example of an information processing system including a semiconductor device according to example embodiments.

Referring to FIG. 11, an information processing system 1300 includes a memory system 1310, which may include at least one of the semiconductor devices according to example embodiments. The information processing system 1300 also includes a modem 1320, a central processing unit (CPU) 1330, a RAM 1340, and a user interface 1350, which may be electrically connected to the memory system 1310 via a system bus 1360. The memory system 1310 may include a memory device 1311 and a memory controller 1312 controlling an overall operation of the memory device 1311. Data processed by the CPU 1330 and/or input from the outside may be stored in the memory system 1310. Here, the memory system 1310 may be provided as a solid state drive SSD, and thus, the information processing system 1300 may be able to store reliably a large amount of data in the memory system 1310. This increase in reliability enables the memory system 1310 to conserve resources for error correction and realize a high speed data exchange function. Although not shown in the drawing, it will be apparent to those of skill in the art that the information processing system 1300 may be also configured to include an application chipset, a camera image processor (CIS), and/or an input/output device.

By way of summation and review, in flash memory devices using FN Tunneling, the formation of memory cells may include removing or partially removing an ONO layer from a gate pattern of a transistor, such that the gate pattern then has a structure of oxide/poly/metal.

Due to the partial removal of the ONO layer, a floating poly gate and a control poly gate may be in contact with each other. Thus, there is a possibility that impurities contained in the floating poly gate could diffuse into the metal layer through the control poly gate. In addition, this diffusion of impurities could occur during a subsequent thermal process that may be carried out to improve characteristics of the device. Electric resistance of the polysilicon layer is inversely proportional to concentration of impurities therein. Accordingly, the diffusion of impurities may lead to an increase in interfacial resistance between the polysilicon layer and the metal layer.

Example embodiments provide semiconductor devices with improved electric characteristics. Example embodiments also provide methods of fabricating a semiconductor device with improved electric characteristics According to example embodiments, a ground selection gate electrode and a string selection gate electrode may be configured to include a diffusion barrier pattern interposed between lower and upper gate patterns in contact with each other. The diffusion barrier pattern may prevent or hinder impurities in the lower gate pattern from being diffused into the upper gate pattern, in which a metal material is contained. Accordingly, it may be possible to prevent or reduce the possibility of a change in doping concentration of the lower gate pattern. An increase in interfacial resistance between the lower and upper gate patterns may be prevented or reduced.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:
1. A semiconductor device, comprising:
a lower insulating pattern disposed on a substrate;
a lower gate pattern disposed on the lower insulating pattern;
a residual insulating pattern disposed on the lower gate pattern;
a first upper gate pattern disposed on the residual insulating pattern, wherein an opening is formed in the first upper gate pattern, the residual insulating pattern and a portion of the lower gate pattern;

a diffusion barrier pattern disposed on an upper surface of the first upper gate pattern and a side surface of the first upper gate pattern, wherein the side surface of the first upper gate pattern is adjacent to the opening; and a second upper gate pattern disposed on the diffusion barrier pattern and filling the opening, wherein an upper surface of the second upper gate pattern in the opening is below an upper surface of the diffusion barrier pattern disposed on the upper surface of the first upper gate pattern.

2. The semiconductor device of claim 1, wherein the diffusion barrier pattern directly contacts the first upper gate pattern.

3. The semiconductor device of claim 1, wherein the diffusion barrier pattern directly contacts the second upper gate pattern.

4. The semiconductor device of claim 1, wherein the diffusion barrier pattern has an L-shape on the upper surface of the first upper gate pattern and the side surface of the first upper gate pattern.

5. The semiconductor device of claim 1, wherein the diffusion barrier pattern includes silicon oxide, silicon oxynitride, or silicon nitride.

6. The semiconductor device of claim 1, wherein the residual insulating pattern directly contacts the first upper gate pattern.

7. The semiconductor device of claim 1, wherein the first and second upper gate patterns include polysilicon.

8. The semiconductor device of claim 1, further comprising a metal barrier pattern disposed on the second upper gate pattern in the opening, wherein an upper surface of the metal barrier pattern in the opening is below the upper surface of the first upper gate pattern.

9. A NAND flash memory device comprising:
a lower insulating pattern disposed on a substrate;
a lower gate pattern disposed on the lower insulating pattern;
a residual insulating pattern disposed on the lower gate pattern;
a first upper gate pattern disposed on the residual insulating pattern, wherein an opening is formed in the first upper gate pattern, the residual insulating pattern and a portion of the lower gate pattern;
a diffusion barrier pattern disposed on an upper surface of the first upper gate pattern and a side surface of the first upper gate pattern, wherein the side surface of the first upper gate pattern is adjacent to the opening; and
a second upper gate pattern disposed on the diffusion barrier pattern and filling the opening, wherein the second upper gate pattern does not completely fill the opening.

10. The memory device of claim 9, wherein the diffusion barrier pattern directly contacts the first upper gate pattern.

11. The memory device of claim 9, wherein the diffusion barrier pattern directly contacts the second upper gate pattern.

12. The memory device of claim 9, wherein the diffusion barrier pattern has an L-shape on the upper surface of the first upper gate pattern and the side surface of the first upper gate pattern.

13. The memory device of claim 9, wherein the diffusion harrier pattern includes silicon oxide, silicon oxynitride, or silicon nitride.

14. The memory device of claim 9, wherein the first and second upper gate patterns include polysilicon.

15. A semiconductor device, comprising:
a lower insulating pattern disposed on a substrate;
a lower gate pattern disposed on the lower insulating pattern;
a residual insulating pattern disposed on the lower gate pattern;
a first upper gate pattern disposed on the residual insulating pattern, wherein an opening is formed in the first upper gate pattern, the residual insulating pattern and a portion of the lower gate pattern;
a diffusion barrier pattern disposed on an upper surface of the first upper gate pattern and a side surface of the first upper gate pattern, wherein the diffusion barrier pattern disposed on the side surface of the first upper gate pattern forms a portion of a sidewall of the opening;
a second upper gate pattern disposed on the diffusion barrier pattern and filling the opening; and
a metal barrier pattern disposed on the second upper gate pattern in the opening.

16. The semiconductor device of claim 15, further comprising a peripheral transistor, wherein the peripheral transistor includes:
a lower insulating pattern disposed on the substrate;
a lower gate pattern disposed on the lower insulating pattern;
a residual insulating pattern disposed on the lower gate pattern;
a first upper gate pattern disposed on the residual insulating pattern;
a diffusion barrier pattern disposed on the first upper gate pattern; and
a second upper gate pattern disposed on the diffusion barrier pattern.

17. The semiconductor device of claim 16, wherein the diffusion barrier pattern of the peripheral transistor has a non-planar shape.

18. The semiconductor device of claim 15, wherein the diffusion barrier pattern is in direct contact with the upper surface of the first upper gate pattern and the side surface of the first upper gate pattern.

19. The semiconductor device of claim 15, wherein the diffusion barrier pattern. includes silicon oxide, silicon oxynitride, or silicon nitride.

20. The semiconductor device of claim 15, wherein the first and second upper gate patterns include polysilicon.

* * * * *